United States Patent
Taft et al.

(10) Patent No.: US 12,334,924 B2
(45) Date of Patent: Jun. 17, 2025

(54) METHODS AND APPARATUS TO PREVENT LOCK-UP OF HIGH-SPEED PSEUDO-DIFFERENTIAL FREQUENCY DIVIDER CIRCUITS

(71) Applicant: Texas Instruments Incorporated, Dallas, TX (US)

(72) Inventors: Robert Taft, Munich (DE); Alexander Bodem, Freising (DE); Filip Savic, Munich (DE); Paul Kramer, Timnath, CO (US); Vineethraj Rajappan Nair, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/240,278

(22) Filed: Aug. 30, 2023

(65) Prior Publication Data

US 2025/0080117 A1    Mar. 6, 2025

(51) Int. Cl.
*G06F 1/08* (2006.01)
*H03K 19/20* (2006.01)
*H03K 21/00* (2006.01)

(52) U.S. Cl.
CPC .............. *H03K 21/00* (2013.01); *G06F 1/08* (2013.01); *H03K 19/20* (2013.01)

(58) Field of Classification Search
CPC ..... G06F 1/04; G06F 1/06; G06F 1/08; G06F 7/68; H03K 19/20; H03K 21/00; H03K 21/02; H03K 21/026; H03K 21/08; H03K 21/10

See application file for complete search history.

(56) References Cited

U.S. PATENT DOCUMENTS 8,901,978 B2 * 12/2014 Ma ................. H03L 7/0816
                                                327/158
11,106,236 B2    8/2021 Taft et al.
11,909,407 B2 * 2/2024 Rathee ............... H03L 7/148

OTHER PUBLICATIONS

Kado et al., "An Ultralow Power CMOS/SIMOX Programmable Counter LSI," IEEE Journal of Solid-State Circuits, vol. 32, No. 10, Oct. 1997, 7 pages.
Texas Instruments, "10.24-GSPS, 16-bit, Dual and Single Channel, Multi-Nyquist Digital-to-Analog Converter (DAC) with JESD204B, C Interface," May 2023, 178 pages.

* cited by examiner

*Primary Examiner* — Long Nguyen
(74) *Attorney, Agent, or Firm* — Mandy Barsilai Fernandez; Frank D. Cimino

(57) ABSTRACT

An example apparatus includes: first through eighth gated inverters each having inputs and outputs; a first and second inverter each having an input and an output, the output of the first inverter coupled to the input of the second gated inverter, the output of the second inverter coupled to the input of the third gated inverter; the fifth gated inverter coupled to the input of the first gated inverter and the input of the first inverter; the sixth gated inverter coupled to the input of the second inverter and the input of the fourth gated inverter; the seventh gated inverter coupled to the output of the first gated inverter and the output of the third gated inverter; the eighth gated inverter coupled to the output of the second gated inverter and the output of the fourth gated inverter; and a bus-holder circuit between the seventh and eighth gated inverter inputs.

23 Claims, 9 Drawing Sheets

US 12,334,924 B2

METHODS AND APPARATUS TO PREVENT LOCK-UP OF HIGH-SPEED PSEUDO-DIFFERENTIAL FREQUENCY DIVIDER CIRCUITS

TECHNICAL FIELD

This description relates generally to circuits and, more particularly, to methods and apparatus to prevent lock-up of high-speed pseudo-differential frequency divider circuits.

BACKGROUND

A frequency divider is a circuit that divides down a frequency of an input clock. Frequency dividers can divide frequencies using fixed or selectable integer ratios. A frequency divider may be implemented using common-mode logic (CML) including a differential pair (e.g., a two-transistor circuit) and resistor loads to use differential input signals to create true differential outputs. Frequency dividers may be used in communication circuits, audio circuits, and/or any other circuit needing to divide the frequency of an input clock.

SUMMARY

For methods and apparatus to prevent lock-up of high-speed pseudo-differential frequency divider circuits, an example apparatus includes first through eighth gated inverters each having inputs and outputs; first and second inverters each having an input and an output, the output of the first inverter coupled to the input of the second gated inverter, the output of the second inverter coupled to the input of the third gated inverter; the fifth gated inverter coupled to the input of the first gated inverter and the input of the first inverter; the sixth gated inverter coupled to the input of the second inverter and the input of the fourth gated inverter; the seventh gated inverter coupled to the output of the first gated inverter and the output of the third gated inverter; and the eighth gated inverter coupled to the output of the second gated inverter and the output of the fourth gated inverter. In some examples, the first, second, third, and fourth gated inverters are half the strength of the fifth, sixth, seventh, and eighth gated inverters.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
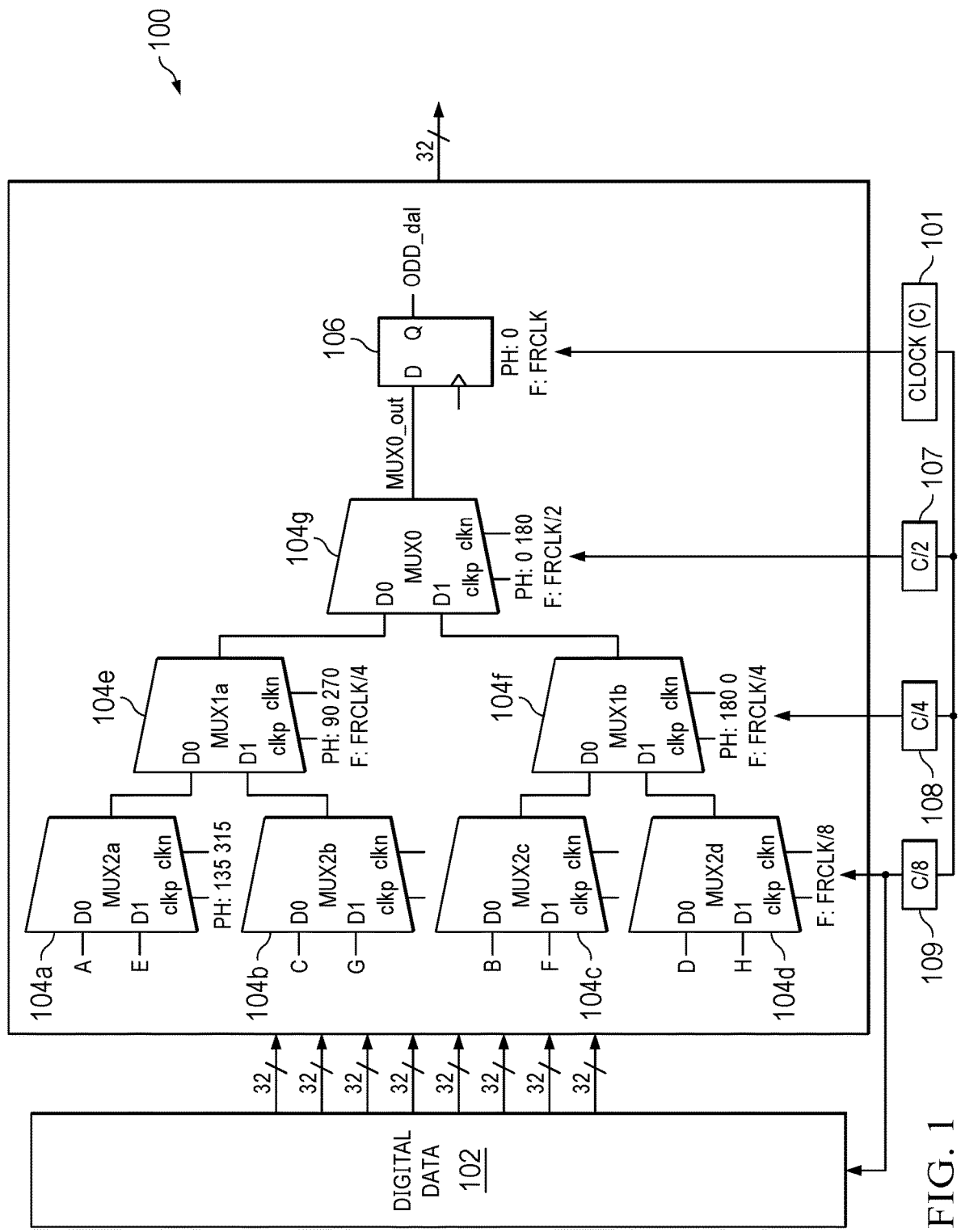
FIG. 1 is a system diagram of a 32:1 cascaded multiplexer system which can be utilized in a digital-to-analog converter with split cross-coupled pseudo-differential frequency divider circuits.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Examples disclosed herein may be used to implement split cross-coupled pseudo-differential frequency divider circuits that prevent lock-up and/or prevent common-mode frequency-divided clock signal outputs from propagating through high-speed pseudo-differential logic. A frequency divider circuit is used to divide a frequency of an input clock based on a fixed or selectable integer ratio. For example, a 1:2 ratio implements a divide-by-two frequency divider, a 1:3 ratio implements a divide-by-three frequency divider, etc. Frequency division and examples disclosed herein are useful in many types of electronic circuits including digital-to-analog converters (DACs), analog-to-digital converters (ADCs), phase locked loop (PLL) circuits, communication circuits, audio circuits, satellite equipment, and/or any other circuit in which multiple clock frequencies are utilized.

As noted above, examples disclosed herein may be used in a variety of applications. For example, a DAC circuit may operate at a guaranteed 10.24 GHz frequency over process, voltage, temperature (PVT) and aging (e.g., a gradual weakening of a transistor over time). However, the digital data for high-speed DACs are often not provided as a single stream, rather as several parallel streams, referred to as interleaving. Interleaving occurs when multiple divided output clocks of a frequency divider are used in parallel to process multiple streams of data (e.g., to encode or decode data) in parallel, and the multiple parallel processed streams are then multiplexed together for subsequent streaming or communication at the frequency of the original clock frequency which is input to the frequency divider. For example, in an interleaving process, a 10.24 GHz clock applied to a DAC is buffered and used to re-sample digital data sent to output current-steering elements. To enable such interleaving, a pseudo-differential frequency divider circuit generates multiple parallel output clock signals at multiple stages simultaneously. In addition, the pseudo-differential frequency divider circuit includes a first frequency divider loop to output non-inverted clock signals at the multiple stages and an opposing second frequency divider loop to output corresponding inverted clock signals at the multiple stages. Each inverted clock signal output in one frequency divider loop is out of phase by 180 degrees relative to its non-inverted clock signal output in the other frequency divider loop.

One clock is typically utilized and divided down to generate the intended reduced clock frequencies. When processing circuitry is capable of performing digital processing of the control signals at a much lower rate (e.g., at 10.24 GHZ/8=1.28 GHZ), eight data streams running at 1.28 GHz are multiplexed together to create a single data stream at 10.24 GHz which is then re-sampled and sent to the output current-steering elements. To successfully multiplex the eight data streams together, a multiplexer (MUX) requires the eight phases of the divide-by-eight frequency divider outputs to be edge-aligned to the full-rate 10.24 GHZ DAC input clock. The phase alignment, deterministic start-up, and high-speed operation may result in lockup of prior complementary metal-oxide semiconductor (CMOS) frequency divider circuits.

Lock-up of a prior CMOS frequency divider circuit is sometimes due to noise or other upsets introduced in the high-speed frequency divider. For example, when used in satellite equipment operating in space, heavy ion strikes can cause circuit disruptions that change the operation mode of a prior divider circuit and lead to lock-up. Under lock-up, the prior CMOS frequency divider circuit continues to operate but in an undesired common-mode fashion in which an intended non-inverted output clock signal (e.g., at a first frequency divider loop) and its corresponding intended inverted output clock signal (e.g., at an opposing second frequency divider loop) are both in phase (e.g., intended differential output frequency-divided clock signals are actually outputting the same value instead of outputting opposite values to generate clock signal pairs out of phase by 180 degrees). This results in circuits connected to the output clocks of the prior CMOS frequency divider circuit failing and drawing an increased amount of power.

Unlike prior CMOS frequency divider circuits that are vulnerable to lock-up by entering an unwanted common-mode operation, examples disclosed herein implement split cross-coupled pseudo-differential frequency divider circuits that substantially reduce or eliminate lock-up and prevent common-mode operation even at higher input clock speeds than could be successfully handled by prior CMOS frequency divider circuits. As described in detail below, by replacing a pseudo-differential latch in a pseudo-differential frequency divider circuit with a split cross-coupled pseudo-differential latch, a common-mode signal cannot propagate to subsequent pseudo-differential latches, thereby substantially reducing or eliminating instances of unwanted common-mode operation. Pseudo-differential CMOS circuits can go into undesired common-mode oscillation, which isn't possible in fully differential CML.

FIG. 1 is a system diagram of a 32:1 cascaded multiplexer system which can be used in a DAC 100 which is connected to a clock source 101 and a digital data source 102. The 32:1 cascaded multiplexer system 100 includes several multiplexers (MUX) 104a-104g connected in a cascade arrangement, and a D flip-flop 106. Multiple frequency dividers 107, 108, 109 are coupled to the 32:1 cascaded multiplexer system 100, the clock source 101, and the digital data source 102. The clock source 101 outputs two complementary clock signals (clk and clkb) in that they are out of phase with one another by 180 degrees (e.g., a non-inverted clock signal and a corresponding inverted clock signal). References to the clock source 101 being connected to a frequency divider, as described below, entails both complementary clock signals (clk and clkb) connected to that frequency divider. In addition, each frequency divider 107, 108, 109 generates two output complementary frequency-divided clock signals. Divide-by-eight frequency divider 109 creates eight phases, and divide-by-four frequency divider 108 creates four phases. As such, descriptions of a frequency divider 107, 108, 109 being connected to a MUX 104a-104g entail output complementary frequency-divided clock signals being connected from that frequency divider 107, 108, 109 to a corresponding one of the MUXs 104a-104g.

In the cascade arrangement of FIG. 1, the digital data source 102 includes eight digital output channels connected to a first stage of multiplexers 104a-104d. Each of the first stage multiplexers 104a-104d includes an output that is connected to an input of a multiplexer in a second stage, for example MUX 104a and MUX 104b include outputs that are connected to inputs of MUX 104e, whereas MUX 104c and MUX 104d include outputs that are connected to inputs of MUX 104f. The two multiplexers in the second stage (MUX 104e and MUX104f) include outputs that are connected to inputs of a third stage multiplexer 104g. The last MUX of the cascade 104g is connected to the D-flip-flop 106. The divide-by-eight synchronous frequency divider 109 is connected to the control inputs of the multiplexers 104a-104d as well as the input of the digital data source 102. The divide-by-four synchronous frequency divider 108 is connected to the control inputs of the multiplexers 104e and 104f. The divide-by-two synchronous frequency divider 107 is connected to the control inputs of the multiplexer 104g.

Synchronous frequency dividers 107, 108, 109 are digital circuits that take input clock signals and produce output clock signals with a reduced frequency while maintaining synchronization with the original clock signal. They are shown as separate in this description but could be one larger merged circuit. A synchronous frequency divider divides the frequency of the input clock by a specific factor or factors. As shown in the example of FIG. 1, the divide-by-two synchronous frequency divider 107, the divide-by-four synchronous frequency divider 108, and the divide-by-eight synchronous frequency divider 109 divide the frequency of the input clock by two, four, and eight, respectively.

The digital data source 102 has a divide-by-8 divided down clock frequency as an input that is provided by the divide-by-8 frequency divider 109, and outputs 8 data slices of 32 bits each. The digital data source 102 utilizes the clock signal from the divide-by-8 frequency divider 109 as an input to provide synchronization and timing for the transmission of digital data. The digital data source 102 sends each of the eight data slices to one of the eight available multiplexer ports.

Each multiplexer 104a-104d takes input data signals from the digital data source 102 and selects the input data signals into one output signal based on control inputs. In FIG. 1, each multiplexer shown is a 2:1 MUX, meaning one of two data input signals is selected as a data output. The 2:1 MUX takes the two streams as an input and merges them into a single stream, with data outputted at twice the rate. The control inputs determine which of the data input signals gets selected and routed to the output signal within each MUX. As seen in FIG. 1, the control inputs to each multiplexer are differential clock inputs "clkp" and "clkn", which are the high frequency input clocks that are 180 degrees out of phase with one another.

A D-flip-flop 106 is a logic device that takes a single data value, stores that data value, and outputs the data value based on the control of a clock signal. The inputs to the D-flip-flop 106 are the third stage multiplexer 104g and the clock source 101. The output of the D-flip-flop 106 is Q, which represents the stored state of the data input signal at the moment the clock signal changes. D-flip-flop 106 synchronizes the digital data to the high-speed clock (C).

In operation, the digital data source 102 provides 8 data slices of 32 bits to the 32:1 cascaded multiplexer system 100, where each bit has a unique data slice connected to cascaded multiplexers. The 32:1 cascaded multiplexer system 100 represents the circuit slice required by one bit, and there are 32 of these in parallel, all of them using the same C/8, C/4, C/2, and C clocks described earlier. The multiplexers 104a-104d in the first stage use a divide-by-8 divided down clock frequency as control inputs to select the output from the 8 data slices. The resulting four data slice outputs from the four 2:1 multiplexers 104a-104d are inputs to the second stage multiplexers 104c-104f. In the second stage, the multiplexers 104-104f use a divide-by-4 divided down clock frequency as control inputs to select the output from the four data slice inputs down to two data slice outputs. These two data slice outputs become the input to the MUX in the third stage, which uses a divide-by-2 frequency divider as a control input to select the final output data slice which is input to the D-flip-flop 106. The D-flip-flop 106 uses the source clock 101 to output the stored state of the data slice input when the clock signal transitions and produces a single 32-bit data slice as an output.

As explained above, a DAC is one circuit that benefits from clock dividers that do not experience lock-up during operation. Of course, frequency dividers, as disclosed herein, have broader applications beyond DAC operation.

Figure 2:
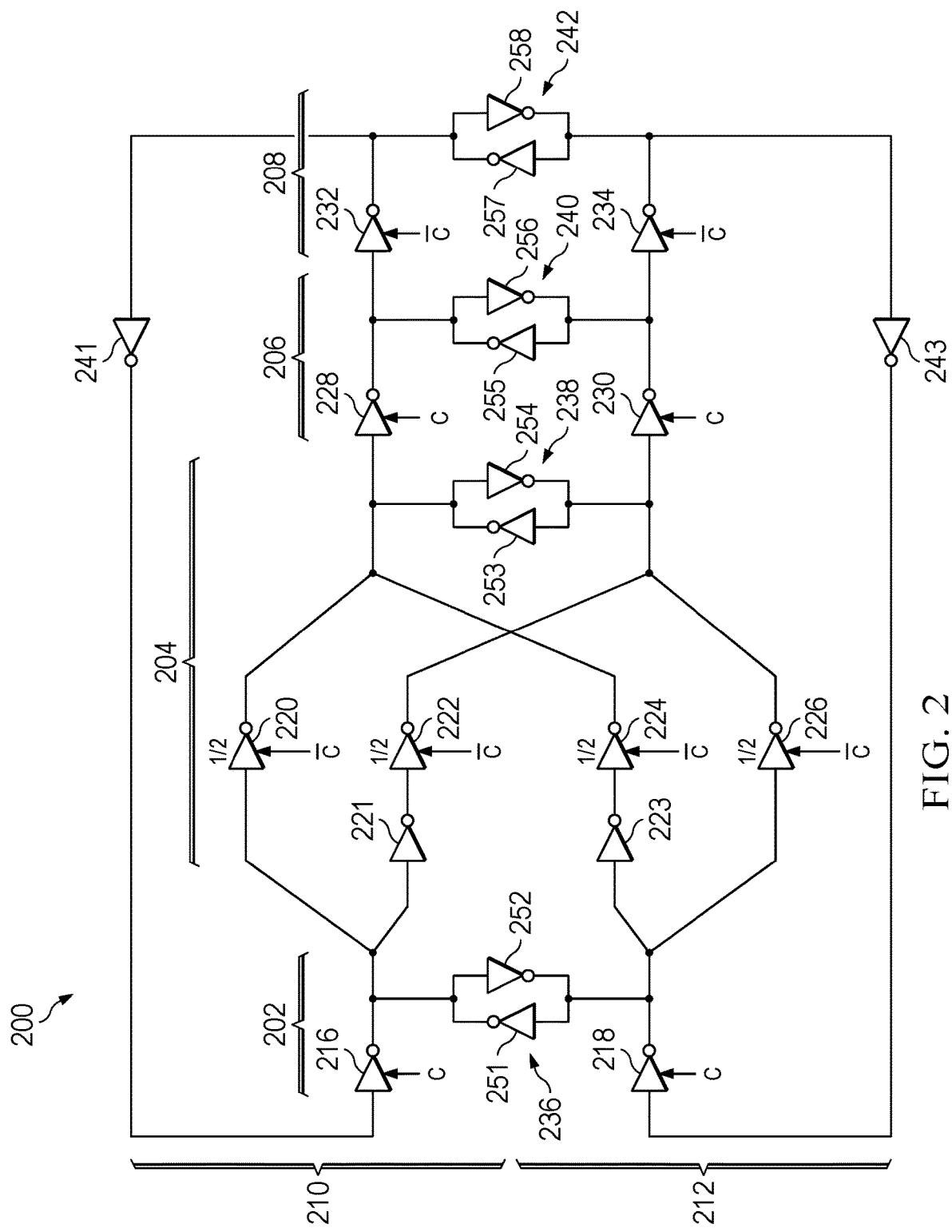
FIG. 2 is a schematic diagram of an example split cross-coupled pseudo-differential frequency divider that may be used in connection with the 32:1 cascaded multiplexer system of FIG. 1.

FIG. 2 is a circuit diagram of a split cross-coupled pseudo-differential frequency divider circuit 200 as a divide-by-four frequency divider, which is an example implementation of the divide-by-four frequency divider 108 in FIG. 1. The split cross-coupled pseudo-differential frequency divider circuit 200 includes four pseudo-differential gated inverter circuit stages 202, 204, 206, 208 that are connected across two frequency divider loops, shown as an "upper" frequency divider loop 210 and a "lower" frequency divider loop 212. The words "upper" and "lower" are used for ease of description and have no bearing on the actual positions of the frequency divider loops 210 and 212 relative to one another or other circuitry shown or not shown in FIG. 2.

The split cross-coupled pseudo-differential frequency divider circuit 200 of FIG. 2 includes four stages 202, 204, 206, 208. Each stage 202, 204, 206, 208 contributes to the overall frequency division of the frequency divider 200. Each stage 202, 204, 206, 208 propagates a signal with a delay in accordance with the alternation of the clock signal state. The output of each stage 202, 204, 206, 208 becomes the input for the next stage to create a propagating effect where the input clock frequency has a division ratio achieved by the number of stages. Overall, the frequency divider 200 takes an input clock signal and produces output clock signals with a lower frequency by dividing the input clock's frequency through delay elements. The frequency divider 200 enables synchronization of different components within a digital system by providing slower clock signals for specific operations or timing requirements. The frequency divider circuit 200 utilizes complementary clock signals (clk and clkb) as inputs to the gated inverters. A differential signal is propagated through the cross-coupled pseudo-differential frequency divider circuit 200.

In FIG. 2, a first-stage pseudo-differential gated inverter circuit 202 includes a first gated inverter 216 of the upper frequency divider loop 210, a second gated inverter 218 of the lower frequency divider loop 212, and a bus-holder circuit 236. Each of the gated inverters 216, 218 takes an input signal and inverts the input signal to produce an output signal when the gate signal enables the gated inverter 216, 218. The output of the gated inverter 216 in the upper frequency divider loop is connected to the output of the gated inverter 218 in the lower frequency divider loop by a bus-holder circuit 236. The bus-holder circuit 236 includes cross-coupled inverters 251, 252, which are weaker than the gated inverters 216 and 218. In this manner, the cross-coupled inverters 251, 252 do not interfere with the drive strengths of the gated inverters 216, 218 when the gated inverters 216, 218 are enabled to output corresponding values. However, when the gated inverters 216 and 218 are disabled and their outputs are in high-impedance states (hi-z states), the bus-holder circuit 236 continues to hold the last output values of the gated inverters 216 and 218. In examples disclosed herein, the cross-coupled inverters 251, 252 are characterized as weaker than the gated inverters 216, 218 in that the cross-coupled inverters 251, 252 have a higher resistance or lower current-carrying capacity and accordingly have a lower driving capability relative to the gated inverters 216, 218.

Each gated inverter of the pseudo-differential CMOS frequency divider circuit 200 includes an input terminal, an output terminal, and an output-enable terminal. The output-enable terminals are labeled "C" or "C" (also referred to as Char). The output-enable labels "C" and the output-enable labels "C" denote how input clocks (clk, clkb) are connected to internal transistors of the gated inverter circuits to drive an output value or to place the gated inverter outputs in a high-impedance output state (hi-z state), as described below in connection with FIG. 4.

A pseudo-differential latch in a first-stage pseudo-differential gated inverter circuit 202 includes two gated inverters 216, 218 creating two differential outputs that are connected via two cross-connected inverters 251, 252. The cross-connected inverters 251, 252 are referred to herein as the bus-holder circuit 236. The bus-holder circuit 236 is connected between the differential outputs, or nodes, of the first stage 202. The bus-holder circuit 236 helps to hold output values of the gated inverters 216, 218 at the pseudo-differential latch of the first stage 202 when outputs of the gated inverters 216, 218 are disabled and in a high-impedance state. By holding the output values, the bus-holder circuit 236 maintains an inversion of the output frequency-divided clock signal from the upper frequency divider loop 210 relative to the lower frequency divider loop 212 and, thus, an inversion of the corresponding complementary output frequency-divided clock from the lower frequency divider loop 212 relative to the upper frequency divider loop 210, meaning that, at any instance in time, the output frequency-divided clock signal on the upper frequency divider loop 210 has the opposite logic value relative to the complementary output frequency-divided clock from the lower frequency divider loop 212 (e.g., a logic one value of "1" for one differential output, and a logic zero value of "0" for the other differential output).

In FIG. 2, the first-stage pseudo-differential gated inverter circuit 202 is connected to the second stage, or the second-stage cross-coupled pseudo-differential gated inverter circuit stage 204, by coupling the second stage 204 to a first node at the output of the gated inverter 216 of the upper frequency divider loop 210 and a second node at the output of the gated inverter 218 of the lower frequency divider loop 212. The cross-coupled pseudo-differential gated inverter circuit stage 204 includes two inverters 221, 223, four half-strength gated inverters 220, 222, 224, 226, and a bus-holder circuit 238.

Drive strengths of the gated inverters of the pseudo-differential CMOS frequency divider circuit 200 can be defined based on example transistor design principles as follows. Drive strength (e.g., output strength) of a circuit component (e.g., gated inverters or inverters of the pseudo-differential CMOS frequency divider circuit 200) corresponds to how much electrical current the circuit component can provide to drive connected loads. The circuit component drive strength is also indicative of the speed at which the circuit component can switch between logic states (e.g., switch between driving a logic "0" and driving a logic "1"). In examples disclosed herein, circuit component drive strength is dependent on transistor characteristics. Example transistor characteristics that affect drive strength include physical characteristics such as gate channel width and/or number of gate fingers in a transistor because such characteristics affect electrical current flow through the transistor. In a transistor, a gate channel forms a path for electrons to flow between source and drain terminals when the transistor is in an "ON" state. A wider gate channel allows more electrical current to flow between the source and drain terminals than a narrow gate channel, resulting in a stronger drive strength for a wider gate channel. For examples in which a transistor is implemented with multiple gate fingers, the multiple gate fingers form a path for electrons to flow between source and drain terminals when the transistor is in an "ON" state. Increasing the number of gate fingers in a transistor allows more electrical current to flow between the source and drain terminals, resulting in a stronger drive strength.

Using the above example transistor design principles, the half-strength gated inverters 220, 222, 224, 226 can be implemented with narrower gate channels and/or fewer gate fingers relative to channel widths and/or numbers of fingers of the other gated inverters 216, 218, 228, 230, 232, 234, resulting in the half-strength gated inverters 220, 222, 224, 226 allowing less electrical current flow between their source and drain terminals and, thus, having an weaker drive strengths than the other gated inverters 216, 218, 228, 230, 232, 234. For example, a drive strength of each of the half-strength gated inverters 220, 222, 224, 226 is approximately half the drive strength of the gated inverter 216.

In FIG. 2, the first node at an upper output of the first stage 202 for the upper frequency divider loop 210 is an input in the upper frequency divider loop 210 to the second stage 204, and the second node at a lower output of the first stage 202 for the lower frequency divider loop 212 is an input in the lower frequency divider loop 212 to the second stage 204. The first node at the output of the gated inverter 216 in the upper frequency divider loop 210 is coupled to a first path and a second path, and the second node at the output of the gated inverter 218 in the lower frequency divider loop 212 is coupled to a third path and a fourth path.

In the second stage 204 of the pseudo-differential CMOS frequency divider circuit 200, the first path includes a first half-strength gated inverter 220 with an output connected in the upper frequency divider loop 210 to the bus-holder circuit 238 of the second stage 204.

In the second stage 204 of the pseudo-differential CMOS frequency divider circuit 200, the second path includes a first inverter 221 and a second half-strength gated inverter 222. The output of the gated inverter 216 in the first stage 202 is connected to the input of the first inverter 221, which inverts an input signal and outputs the inverted signal to the second half-strength gated inverter 222. The second half-strength gated inverter 222 inverts the signal when the half-strength gated inverter 222 is enabled (e.g., by differential clocks (clk, clkb) at output-enable terminals of the second half-strength gated inverter 222, as described in connection with FIG. 4, and denoted by the label Char), and outputs the inverted signal. The output of the second half-strength gated inverter 222 is connected at the lower frequency divider loop 212 to the bus-holder circuit 238 of the second stage 204.

In the second stage 204 of the pseudo-differential CMOS frequency divider circuit 200, the third path includes a second inverter 223 and a third half-strength gated inverter 224. The output of the gated inverter 218 in the first stage 202 is connected to the input of the second inverter 223, which inverts an input signal and outputs the inverted signal to the third half-strength gated inverter 224. The third half-strength gated inverter 224 inverts the signal when the half-strength gated inverter is enabled (e.g., by differential clocks (clk, clkb) at output-enable terminals of the third half-strength gated inverter 224, as described below in connection with FIG. 4, and denoted by the label Char), and outputs the inverted signal. The output of the third half-strength gated inverter 224 is connected at the upper frequency divider loop 210 to the bus-holder circuit 238 of the second stage 204.

In the second stage 204 of the pseudo-differential CMOS frequency divider circuit 200, the fourth path includes a fourth half-strength gated inverter 226 with an output connected at the lower frequency divider loop 212 to the bus-holder circuit 238 of the second stage 204.

The bus-holder circuit 238 includes cross-coupled inverters 253, 254. The cross-coupled inverters 253, 254 of the bus-holder circuit 238 hold logic values output by the half-strength gated inverters 220, 222, 224, 226 when the half-strength gated inverters 220, 222, 224, 226 are disabled and their outputs enter a high-impedance state. Examples of the logic values propagated through the pseudo-differential CMOS frequency divider circuit 200 are detailed later in a discussion of FIG. 5. In addition, as described below in connection with FIG. 6, when the first stage 202 is in common-mode operation, the cross-coupled inverters 253, 254 of the bus-holder circuit 238 resolve differential output signals (e.g., output signals of opposite logic values) from the second half-strength gated inverter 222 and the fourth half-strength gated inverter 226 to a first logic value and help to resolve differential output signals (e.g., output signals of opposite logic values) from the first half-strength gated inverter 220 and the third half-strength gated inverter 224 to a second logic value that is opposite the first logic value. In this manner, the second stage 204 of the pseudo-differential CMOS frequency divider circuit 200 enables signals output from the first stage 202 to be inverted and input to the third stage 206.

The half-strength gated inverters 220, 222, 224, 226 with a drive strength of one-half of the full-strength inverters 216, 218, 228, 230, 232, 234 are used in operation to stop propagation of common-mode operation that may arise in the pseudo-differential CMOS frequency divider circuit 200 when logic values of a cross-coupled pseudo-differential gated inverter circuit stage 202, 206, 208 at upper and lower frequency divider loops 210, 212 are the same (e.g., corresponding frequency divided output clocks are in phase). For example, by electrically connecting the outputs of the half-strength gated inverters 220, 224, differential outputs of each half-strength gated inverter 220, 224 generate signal contention at the output of the second stage 204 and the input of the third stage 206. Due to the half strengths of the half-strength gated inverters 220, 224, this signal contention can be resolved to a single logic value of "0" or "1" by the bus-holder circuit 238 faster than if the half-strength gated inverters 220, 224 were implemented by full-strength gated inverters such as the gated inverters 216, 218, 228, 230, 232, 234. The bus-holder circuit 238 similarly resolves signal contention generated as a result of the outputs of the half-strength gated inverters 222, 226 being electrically connected. In the illustrated example, the bus-holder circuit 238 resolves the logic value at the upper frequency divider loop 210 to be opposite the logic value at the lower frequency divider loop 212 for the outputs of the second stage 204. In addition to resolving the signal contentions at the outputs of the half-strength gated inverters 220, 224 and the outputs of the half-strength gated inverters 222, 226 to opposite logic values, the bus-holder circuit 238 also holds the resolved output values of the second stage 204 when outputs of the half-strength gated inverters 220, 222, 224, 226 are disabled and in a high-impedance state. Example signaling of how the pseudo-differential CMOS frequency divider circuit 200 stops propagation of common-mode operation is described below in connection with FIG. 6.

In some examples, the half strengths of the half-strength gated inverters 220, 222, 224, 226 may also be used for power savings, noise reduction, and signal conditioning. In some low-power applications, reducing the signal strength when strong signals are not needed helps to conserve power. By using a gated inverter with a drive strength that is one-half the strength of that of a full-strength inverter, the outputs of the first and third gated inverters 220, 224 add up during operation to match that of a full-strength inverter. In the same way, the second and fourth gated inverters 222, 226 add up during operation to match that of a full-strength inverter. That is, the cross-coupled pseudo-differential latch of the second stage 204 behaves in a manner similar to the manner of the pseudo-differential latch of the first stage 202 when differential signals are input to the gated inverters 216, 218 from corresponding ones of the inverters 241, 243. As described briefly above, when input signals to the gated inverters 216, 218 from the inverters 241, 243 are non-differential, (e.g., in common mode), the cross-coupled pseudo-differential latch of the second stage 204 suppresses common mode signal propagation by resolving the propagated frequency divided signals of the upper frequency divider loop 210 and the lower frequency divider loop 212 back to differential signals.

The second-stage cross-coupled pseudo-differential gated inverter circuit 204 has an output connected to third and fourth nodes at the input of the third-stage pseudo-differential gated inverter circuit 206. The third-stage pseudo differential gated inverter circuit 206 includes a third gated inverter 228, a fourth gated inverter 230, and a bus-holder circuit 240. When enabled, the third gated inverter 228 inverts the input signals and outputs the inverted signals in the upper frequency divider loop 210 to the bus-holder circuit 240. In parallel, the fourth gated inverter 230 inverts the input signals and outputs the inverted signals in the lower frequency divider loop 212 to the bus-holder circuit 240. The bus-holder circuit 240 includes cross-coupled inverters 255, 256.

In the third stage 206 of the pseudo-differential CMOS frequency divider circuit 200, the third gated inverter 228 inverts the input signals and outputs inverted signals when enabled by C (e.g., by differential clocks (clk, clkb) at output-enable terminals of the third gated inverter 228 as described below in connection with FIG. 4). In the lower frequency-divider loop 212, the fourth gated inverter 230 inverts the input signals and outputs inverted signals when enabled by C (e.g., by differential clocks (clk, clkb) at output-enable terminals of the fourth gated inverter 230 as described below in connection with FIG. 4). The bus-holder circuit 240 of the third stage 206 holds the logic values output from the third gated inverter 228 and the fourth gated inverter 230 when those gated inverters 228, 230 are disabled (e.g., by the differential clocks (clk, clkb) at the output-enable terminals as described below in connection with FIG. 4) and the outputs of the gated inverters 228, 230 enter a high-impedance state. The bus-holder circuit 240 includes cross-coupled inverters 255, 256. To restate, these cross-coupled inverters 255, 256 are weaker than the gated inverters 228, 230 in the respective stage (e.g., the third stage 206) of the frequency divider 200, to allow the gated inverters 228 and 230 to drive their outputs when they are enabled. Also, the weaker the cross-coupled inverters 255, 256 are, the faster the circuit operates, since the cross-coupled inverters 255, 256 fight against voltage changes driven by the gated inverters 228, 230.

The fourth stage 208 of the pseudo-differential CMOS frequency divider circuit 200 has its inputs connected to the outputs of the third-stage pseudo-differential gated inverter circuit 206. The fourth-stage pseudo differential gated inverter circuit 208 includes a fifth gated inverter 232, a sixth gated inverter 234, and a bus-holder circuit 242. The fifth gated inverter 232 inverts the input signal and outputs the inverted signal in the upper frequency divider loop 210 to the bus-holder circuit 242. The sixth gated inverter 234 inverts the input signal and outputs the inverted signal in the lower frequency divider loop 212 to the bus-holder circuit 242. The bus-holder circuit 242 includes cross-coupled inverters 257, 258.

In the fourth stage 208 of the pseudo-differential CMOS frequency divider circuit 200, the fifth and sixth gated inverters 232, 234 invert their input signals and output inverted signals when enabled by Char (e.g., by differential clocks (clk, clkb) at output-enable terminals of the inputs of the fifth and sixth gated inverters 232, 234 as described below in connection with FIG. 4). The bus-holder circuit 242 holds the logic values output from the fifth gated inverter 232 and the sixth gated inverter 234 when those gated inverters 232, 234 are disabled (e.g., by the differential clocks (clk, clkb) at the output-enable terminals as described below in connection with FIG. 4) and the outputs of the gated inverters 232, 234 enter a high-impedance state.

After the fourth-stage pseudo-differential gated inverter circuit 208, the output flows through a first feedback inverter 241 and a second feedback inverter 243 and returns to the inputs of the first-stage pseudo-differential gated inverter circuit 202. The outputs of the fourth-stage pseudo-differential gated inverter circuit 208 are connected to the inputs of the feedback inverters 241, 243 which are in series with the inputs of the first-stage pseudo-differential gated inverter circuit 202 to complete the respective upper and lower frequency divider loops 210, 212.

In other implementations, the second-stage cross-coupled pseudo-differential gated inverter circuit 204 can be replaced by a pseudo-differential gated inverter circuit and the second-stage cross-coupled pseudo-differential gated inverter circuit 204 can instead be implemented at a different stage (e.g., replacing the pseudo-differential gated inverter circuit of the fourth stage 208 with the second-stage cross-coupled pseudo-differential gated inverter circuit 204). The replacement can be done at any suitable stage of the split cross-coupled pseudo-differential frequency divider circuit 200. Also, multiple cross-coupled pseudo-differential gated inverter circuits can be used.

Figure 3:
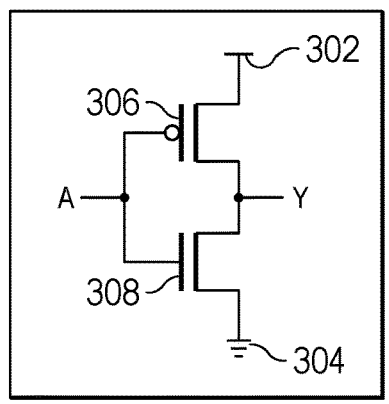
FIG. 3 is a schematic diagram of an example inverter of FIG. 2

FIG. 3 shows an example implementation of a prior feedback inverter 243 of FIG. 2. The prior feedback inverter 243 primarily consists of an NMOS transistor 308 and a PMOS transistor 306. Each transistor includes a source terminal, a drain terminal, and a gate terminal. The NMOS transistor 308 has its source terminal connected to ground 304, its drain terminal connected to the output terminal "Y", and its gate terminal connected to the input terminal "A". The PMOS transistor 306 has its source terminal connected to the power supply voltage 302, its drain terminal connected to the output terminal "Y", and its gate terminal connected to the input terminal "A".

The NMOS transistor 308 is a field-effect transistor that operates by controlling the flow of electrons through an N-type semiconductor channel based on the voltage applied to its gate terminal. An N-type semiconductor channel is formed between the source terminal and the drain terminal. The gate terminal is separated from the channel by a thin insulating layer. The NMOS transistor 308 operates on the principle of a voltage-controlled switch. When a voltage (e.g., a control signal) applied to the gate terminal exceeds a gate threshold voltage (VTH) of the NMOS transistor 308, an electric field is created across the insulating layer. This field forms a conductive N-type semiconductor channel, allowing electrons to flow (the transistor is in the ON state with electrical current passing through the transistor) between the source and drain terminals. When a voltage applied to the gate terminal is less than a gate threshold voltage (VTH) of the NMOS transistor 308, the electric field is weakened and the channel between the source and drain terminals is interrupted (e.g., the transistor is in the OFF state, preventing electrical current flow between the source and drain terminals by entering a high impedance state).

The PMOS transistor 306 is a field-effect transistor that operates by controlling the flow of holes through a P-type semiconductor channel based on the voltage applied to its gate terminal. A P-type channel is created between the source and drain terminals. In example FIG. 3, the source terminal of the PMOS transistor 306 is connected to a positive power supply voltage 302, while the drain terminal of the PMOS transistor 306 is connected to an output terminal "Y". The gate terminal of the PMOS transistor 306 controls the current-conducting behavior of the PMOS transistor 306 and is connected to a control signal. When a voltage applied to the gate terminal exceeds a gate threshold voltage (VTH) of the PMOS transistor 306, the transistor turns OFF because the P-type channel becomes a high-resistance path by entering a high impedance state. On the other hand, when the voltage applied to the gate terminal is below a gate threshold voltage (VTH) of the PMOS transistor 306, the transistor turns ON because the channel becomes a low-resistance path, allowing electrical current to flow between the source and drain terminals.

In the feedback inverter 243, the input terminal "A" is connected to both of the gate terminals of the NMOS transistor 308 and PMOS transistor 306. The output terminal "Y" is connected to the drain terminals of the NMOS transistor 308 and the PMOS transistor 306. The source terminal of the NMOS transistor 308 is connected to ground 304 and the source terminal of the PMOS transistor 306 is connected to the power supply voltage 302.

In operation, when the input signal "A" is low, the PMOS transistor 306 is in the ON state, and the NMOS transistor 308 is in the OFF state. This allows electrical current to flow from the power supply 302 to the output, resulting in a high output voltage at terminal "Y". Conversely, when the input signal "A" is high, the PMOS transistor 306 is in the OFF state and the NMOS transistor 308 is in the ON state. This blocks the electrical current path through the PMOS transistor 306 and prevents electrical current from flowing (enters a high-impedance state) from the power supply 302 to the terminal "Y." Simultaneously, the electrical current flow is enabled from the terminal "Y" to the ground 304, which causes a low output voltage at the terminal "Y". Consequentially, the CMOS inverter performs a logical inversion of the input signals and generates complementary output signals at terminal "Y."

Figure 4:
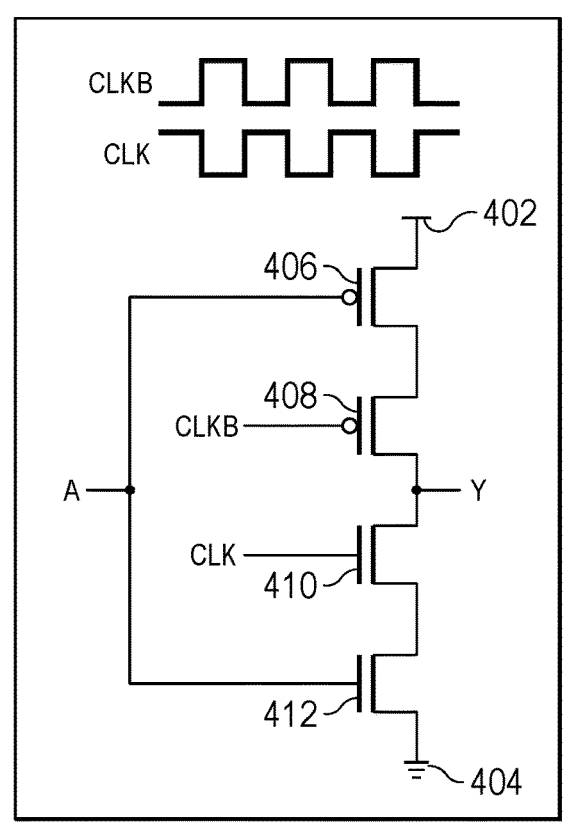
FIG. 4 is a schematic diagram of an example gated inverter of FIG. 2

FIG. 4 is an example implementation of a gated inverter 216 of FIG. 2. The gated inverter 216 includes two sets of two complementary MOSFETs (metal-oxide-semiconductor field effect transistors): a first NMOS transistor 410 and a second NMOS transistor 412 (N-channel MOSFET), and a first PMOS transistor 406 and a second PMOS transistor 408 (P-channel MOSFET). The NMOS transistors 410, 412 and PMOS transistors 406, 408 are connected between a power supply 402 and ground 404. The second NMOS transistor 412 includes a source terminal connected to ground 404 and a drain terminal connected to the source terminal of the first NMOS transistor 410. A drain terminal of the first NMOS transistor 410 is connected to a drain terminal of the second PMOS transistor 408. A source terminal of the second PMOS transistor 408 is connected to a drain terminal of the first PMOS transistor 406. The source terminal of the first PMOS transistor 406 is connected to the power supply 402.

Referring briefly to FIG. 2, differential outputs of a pseudo-differential latch (e.g., the pseudo-differential latch formed by the gated inverter 216 and the gated inverter 218 of the first-stage pseudo-differential gated inverter circuit 202 of FIG. 2) are intended to output opposite values of one another. For example, when the gated inverter 216 outputs a logic value of "1", the gated inverter 218 is expected to output a differential logic value of "0" to form complementary differential outputs of the first stage 202. In example FIG. 2, each gated inverter of the split cross-coupled pseudo-differential frequency divider circuit 200 includes an input terminal, an output terminal, and an output-enable terminal. The output-enable terminals are labeled "C" or "C" (also referred to as Char). The output-enable labels "C" and the output-enable labels "C" denote how differential input clocks (clk, clkb) are connected to gated inverter circuits at the transistor level to drive an output value or to place gated inverter outputs in high-impedance (hi-z) states, as described below.

Returning to FIG. 4, in the example transistor-level diagram of the gated inverter 216, a gate terminal of the first PMOS transistor 406 is connected to a gate terminal of the second NMOS transistor 412 to form an input terminal "A". An output terminal "Y" is located at a connection between a drain terminal of the second PMOS transistor 408 and a drain terminal of the first NMOS transistor 410. The gate terminals of the second PMOS transistor 408 and the first NMOS transistor 410 are provided two separate clock signals that are inverts of one another (e.g., the two separate clock signals are 180 degrees out of phase with one another) such that when a non-inverted clock signal (clk) is in a high state, the other, inverted, clock signal (clkb, also referred to as clock-bar, clockb) is in a low state, as shown by the clock signals diagram of FIG. 4.

In the example transistor-level gated inverter circuit 216, the inverted clock signal (clkb) is connected to the gate terminal of the second PMOS transistor 408, and the non-inverted clock signal (clk) is connected to the gate terminal of the first NMOS transistor 410, which means the output terminal "Y" is in a high-impedance sate (hi-z) (e.g., the output of the gated inverter 216 is disabled) when the inverted clock signal (clkb) is high, and the non-inverted clock signal (clk) is low. Alternatively, when the inverted clock signal (clkb) is low and the non-inverted clock signal (clk) is high, the output terminal "Y" drives an output value that is opposite to an input value applied to the input terminal "A" (e.g., the output of the gated inverter 216 is enabled). To represent this clk, clkb clock-connection configuration, the gated inverter 216 has an output-enable terminal labeled "C" as shown in FIG. 2.

Conversely, if the non-inverted clock signal (clk) is connected to the gate terminal of the second PMOS transistor 408, and the inverted clock signal (clkb) is connected to the gate terminal of the first NMOS transistor 410, the output terminal "Y" is in a high-impedance sate (hi-z) (e.g., the gated inverter output is disabled) when the non-inverted clock signal (clk) is high, and the inverted clock signal (clkb) is low. Alternatively, when the non-inverted clock signal (clk) is low and the inverted clock signal (clkb) is high, the output terminal "Y" drives an output value that is opposite to an input value applied to the input terminal "A" (e.g., the gated inverter output is enabled). To represent this clk, clkb clock-connection configuration, a corresponding gated inverter of the pseudo-differential frequency divider circuit 200 has an output-enable terminal labeled "C" (e.g., as shown for the gated inverter 232 in FIG. 2).

Figure 5:
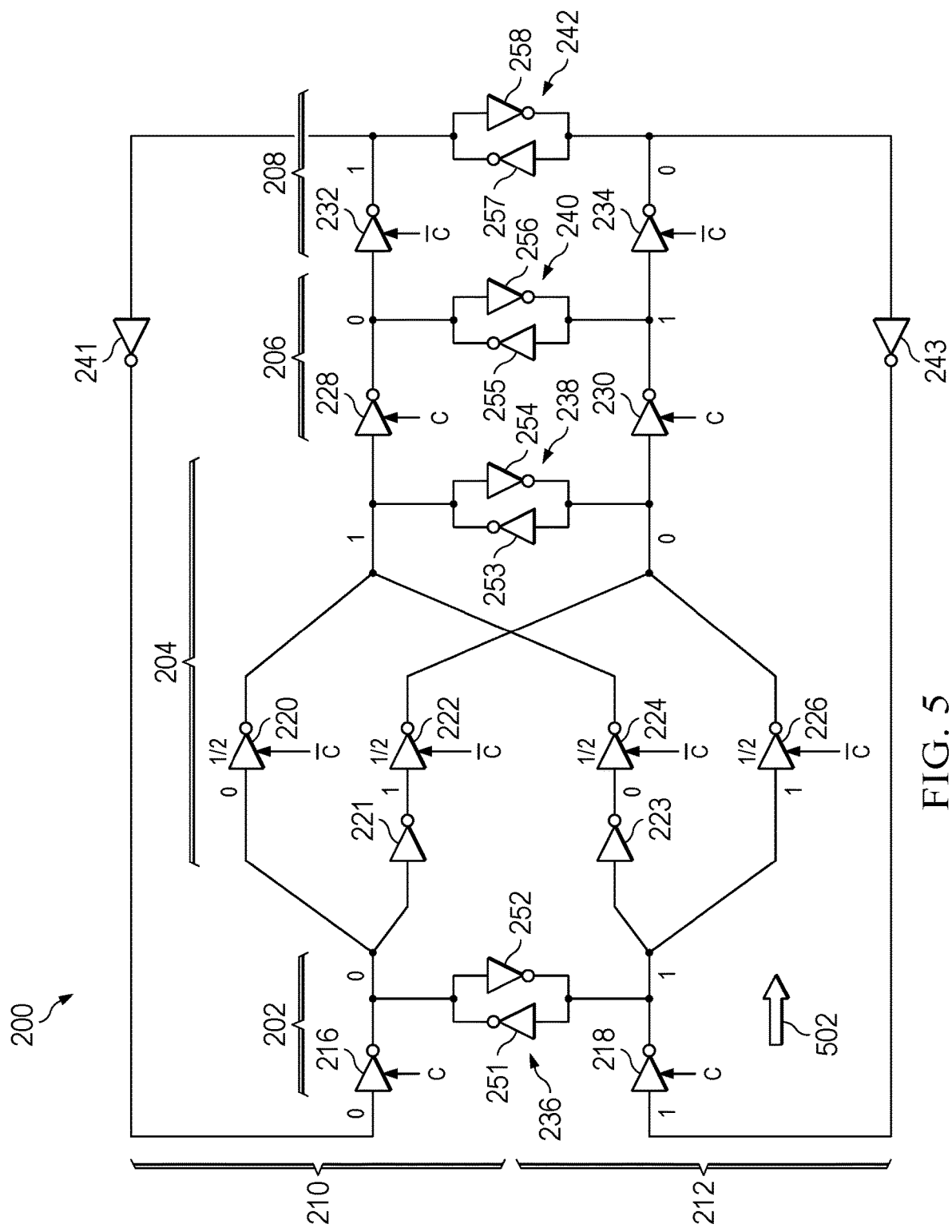
FIG. 5 is the example split cross-coupled pseudo-differential frequency divider circuit of FIG. 2 shown in operation.

FIG. 5 shows the split cross-coupled pseudo-differential frequency divider circuit 200 with logic values (low, or logic zero value, as represented by "0", and high, or logic one value, as represented by "1") at components of different stages 202, 204, 206, 208. In FIG. 5, input signals enter the first stage 202 of the split cross-coupled pseudo-differential frequency divider circuit 200. In the upper frequency divider loop 210 of the first stage 202, a logic value "0" is the input signal to the gated inverter 216. In the lower frequency divider loop 212, a logic value "1" is the input signal to the gated inverter 218. An arrow 502 at the first stage 202 represents that the outputs of the gated inverters 216 and 218 are in a high-impedance state such that the bus-holder circuit 236 is holding the logic values previously driven by the gated inverters 216, 218 when the outputs of the gated inverters 216, 218 were enabled by their output-enable terminals "C". The arrow 502 also indicates that the logic value "0" at the input of the gated inverter 216 and the logic value "1" at the input of the gated inverter 218 will be inverted to opposite values driven at the outputs of the gated inverters 216, 218 at a next clock cycle (e.g., a next clock cycle of the clock signals clk, clkb described above in connection with FIG. 4) so that the logic values "0" and "1" shown in FIG. 5 at the outputs of the gated inverters 216, 218 will switch to opposite logic values. At such time, the gated inverter 216 will output a logic value "1" and the gated inverter 218 will output a logic value "0."

The output signals from the first stage 202 are input signals to the second stage 204 of the split cross-coupled pseudo-differential frequency divider circuit 200. Within each of the upper frequency divider loop 210 and the lower frequency divider loop 212 of the split cross-coupled pseudo-differential frequency divider circuit 200, the respective signals are input to two paths. The first path from the output of the gated inverter 216 has a half-strength gated inverter 220. This half-strength gated inverter 220 has Char as an output-enable terminal. When the Char output-enable terminal of the half-strength gated inverter 220 is enabled and the input to the half-strength gated inverter 220 is logic value "0", as shown in example FIG. 5, the half-strength gated inverter 220 outputs logic value "1" to the upper frequency divider loop 210 of the split cross-coupled pseudo-differential frequency divider circuit 200.

The second path from the output of the gated inverter 216 has an inverter 221 having an output connected to an input of a half-strength gated inverter 222. The half-strength gated inverter 222 includes an output-enable terminal also labeled Cbar. In example FIG. 5, the inverter 221 inverts input logic value "0" to output logic value "1", then propagates that output logic value "1" to the half-strength gated inverter 222 which, when enabled, inverts the signal from logic value "1" to logic value "0". The output signal of logic value "0" is connected to the lower frequency divider loop 212 of the split cross-coupled pseudo-differential frequency divider circuit 200.

The third path from the output of the gated inverter 218 includes an inverter 223 having an output connected to an input of a half-strength gated inverter 224. The half-strength gated inverter 224 includes an output-enable terminal also labeled Cbar. In example FIG. 5, the inverter 223 inverts input logical value "1" to output logic value "0", then propagates that output logic value "0" to the half-strength gated inverter 224 which, when enabled, inverts the signal from logic value "0" to logic value "1". The output signal of logic value "1" is connected to the upper frequency divider loop 210 of the split cross-coupled pseudo-differential frequency divider circuit 200.

A fourth path includes a half-strength gated inverter 226. This half-strength gated inverter 226 has Char as an output-enable terminal. When the Char output-enable terminal of the half-strength gated inverter 226 is enabled and the input to the half-strength gated inverter 226 is logic value "1", as shown in example FIG. 5, the half-strength gated inverter 226 outputs logic value "0" to the lower frequency divider loop 212 of the split cross-coupled pseudo-differential frequency divider circuit 200. As shown in FIG. 5, the logic value "1" on the upper frequency divider loop 210 at the bus-holder circuit 238 perpetuates to a logic value "0" on the lower frequency divider loop 212 through the bus-holder circuit 238, and the logic value "0" on the lower frequency divider loop 212 at the bus-holder circuit 238 perpetuates to the logic value "1" on the upper frequency divider loop 210 through the bus-holder circuit 238. The other bus-holder circuits 236, 240, 242 operate in similar fashion.

FIG. 5 also shows a third stage 206 and fourth stage 208 of the split cross-coupled pseudo-differential frequency divider circuit 200. The third stage 206 and the fourth stage 208 are structured and function similar to the first stage 202. The output signals of the second stage 204 are the input signals to the third stage 206, the output signals of the third stage 206 are the input signals to the fourth stage 208, and the output signals of the fourth stage 208 are input signals to feedback inverters 241, 243 in corresponding ones of the upper frequency divider loop 210 and the lower frequency divider loop 212 of the split cross-coupled pseudo-differential frequency divider circuit 200. The feedback inverters 241, 243 are connected in series with input terminals of corresponding ones of the gated inverters 216, 218 in the first stage 202.

In operation, the sequential series of stages of pseudo-differential gated inverter circuits 202, 204, 206, 208 uses a delay introduced by each stage 202, 204, 206, 208 (e.g., as operated by the non-inverted differential clock signal clk and the inverted differential clock signal clkb described in connection with FIG. 4). Each stage of pseudo-differential gated inverter circuits 202, 204, 206, 208 introduces a delay of propagation time through respective gated inverters, and the cumulative delay through the four stages 202, 204, 206, 208 results in output clock signals having frequencies which are one fourth of the input frequency (e.g., the input frequency of the non-inverted clock signal clk and the inverted clock signal clkb described in connection with FIG. 4).

Figure 6:
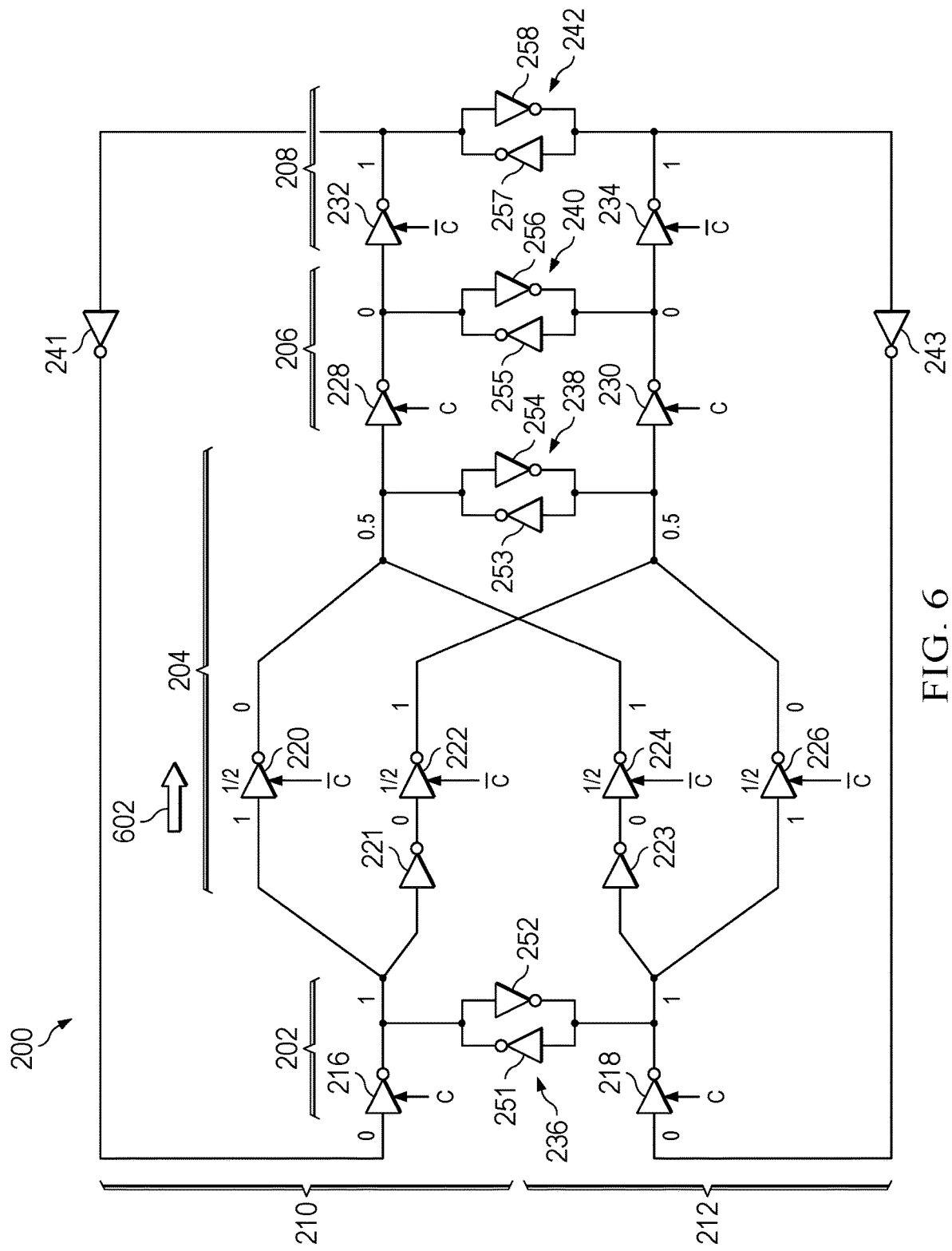
FIG. 6 is the example split cross-coupled pseudo-differential frequency divider circuit of FIG. 2 shown preventing propagation of unwanted common-mode operation.

FIG. 6 shows the split cross-coupled pseudo-differential frequency divider circuit 200 of FIGS. 2 and 5 with logic values at components of different stages 202, 204, 206, 208. FIG. 6 shows common-mode signals originating at the outputs of the third stage 206 and propagating through the fourth stage 208 and the first stage 202. At the first stage 202, input common-mode logic values "0" are inverted by the gated inverters 216, 218 to generate output common-mode inverted logic values "1" at the outputs of the gated inverters 216, 218. The bus-holder circuit 236 in the first stage 202 is unable to restore differential values from the common-mode signals, and the common-mode signals in the upper frequency divider loop 210 and the lower frequency divider loop 212 propagate as common-mode inputs to the second stage 204.

During unwanted common-mode operation when the same logic value is propagated to outputs of both the gated inverter 216 of the upper frequency divider loop 210 and the gated inverter 218 of the lower frequency divider loop 212, the bus-holder circuit 238 resolves contentious differential logic values output from the half-strength gated inverters 220 and 224 and contentious differential logic values output from the half-strength gated inverters 222 and 226, as described below. This stops propagation of the common-mode operation and restores differential frequency divided clock outputs in the split cross-coupled pseudo-differential frequency divider circuit 200. In addition, the bus-holder circuit 238 holds the logic values resolved from the half-strength gated inverters 220, 222, 224, 226 when those half-strength gated inverters 220, 222, 224, 226 are disabled (e.g., by the differential clocks (clk, clkb) at the output-enable terminals as described in connection with FIG. 4) and the outputs of the half-strength gated inverters 220, 222, 224, 226 enter a high-impedance state.

When the first stage 202 is in common-mode operation, common-mode signals are not propagated to the subsequent stages 204, 206, 208 during subsequent clock cycles due to the design of the second-stage cross-coupled pseudo-differential gated inverter circuit stage 204 of the example split cross-coupled pseudo-differential frequency divider circuit 200. If the output signals of the first stage 202 are in common-mode operation with, for example, a logic value of "1", the second stage 204 has a logic value "1" as the input logic signal for both the upper frequency divider loop 210 and lower frequency divider loop 212.

An arrow 602 represents a disable-to-enable transition (e.g., a transition from a high-impedance state to a drive state) of the half-strength gated inverters 220, 222, 224, 226 of the second-stage cross-coupled pseudo-differential gated inverter circuit stage 204 (according to their output-enable terminals Cbar) at which the second stage 204 inverts input logic values to generate inverted output logic values. In the upper frequency divider loop 210 of the split cross-coupled pseudo-differential frequency divider circuit 200, when the first stage 202 is in common-mode operation, the half-strength gated inverter 220, upon being enabled by its output-enable terminal Cbar, outputs logic value "0" to the upper frequency divider loop 210 at the bus-holder circuit 238.

In the upper frequency divider loop 210 of the split cross-coupled pseudo-differential frequency divider circuit 200, when the first stage 202 is in common-mode operation, the inverter 221 inverts its input logical value from "1" to "0" and propagates that signal to the half-strength gated inverter 222. When the half-strength gated inverter 222 is enabled by its output-enable terminal Cbar, the half-strength gated inverter 222 inverts the logic value from "0" to "1". The output signal of logic value "1" is provided to the lower frequency divider loop 212 at the bus-holder circuit 238.

In the lower frequency divider loop 212 of the split cross-coupled pseudo-differential frequency divider circuit 200, when the first stage 202 is in common-mode operation, the inverter 223 inverts its input logic value from "1" to "0" and propagates that signal to the half-strength gated inverter 224. When the half-strength gated inverter 224 is enabled by its output-enable terminal Cbar, the half-strength gated inverter 224 inverts the logic value from "0" to "1." The output signal of logic value "1" is provided to the upper frequency divider loop 210 at the bus-holder circuit 238. Since the logic value "0" output of the gated inverter 220 and the logic value "1" output of the gated inverter 224 are different, they create signal contention represented by mid-rail value "0.5" at the bus-holder circuit 238 for the upper frequency divider loop 210.

In the lower frequency divider loop 212 of the split cross-coupled pseudo-differential frequency divider circuit 200, when the first stage 202 is in common-mode operation, the half-strength gated inverter 226, upon being enabled by its output-enable terminal Cbar, outputs logic value "0" to the lower frequency divider loop 212 at the bus-holder circuit 238. Since the logic value "1" output of the gated inverter 222 and the logic value "0" output of the gated inverter 226 are different, they create signal contention represented by mid-rail value "0.5" at the bus-holder circuit 238 for the lower frequency divider loop 212.

As represented in the above common-mode situation in connection with FIG. 6, two conflicting output signals from the half-strength gated inverters 220, 224 and two conflicting output signals from the half-strength gated inverters 222, 226 are attempting to drive corresponding logic levels at corresponding ones of the upper frequency divider loop 210 and the lower frequency divider loop 212 simultaneously. The second-stage cross-coupled pseudo-differential gated inverter circuit stage 204 uses these competing signals and resulting signal contention at its outputs of the upper and lower frequency divider loops 210, 212 to restore differential frequency divided clock outputs at the second stage bus-holder circuit 238 so that common-mode cannot be propagated.

To resolve the mid-rail values "0.5" at the bus-holder circuit 238 to differential signals at the upper and lower frequency divider loops 210, 212, the bus-holder circuit 238 resolves the signal contention mid-rail value "0.5" from the second half-strength gated inverter 222 and the fourth half-strength gated inverter 226 to a first logic value and resolves the signal contention mid-rail value "0.5" from the first half-strength gated inverter 220 and the third half-strength gated inverter 224 to a second logic value that is opposite the first logic value. In this manner, the second-stage cross-coupled pseudo-differential gated inverter circuit stage 204 restores differential mode operation of the pseudo-differential CMOS frequency divider circuit 200 so that differential frequency divided clock signals at the upper and lower frequency divider loops 210, 212 are correctly propagated to the third stage 206.

Figure 7:
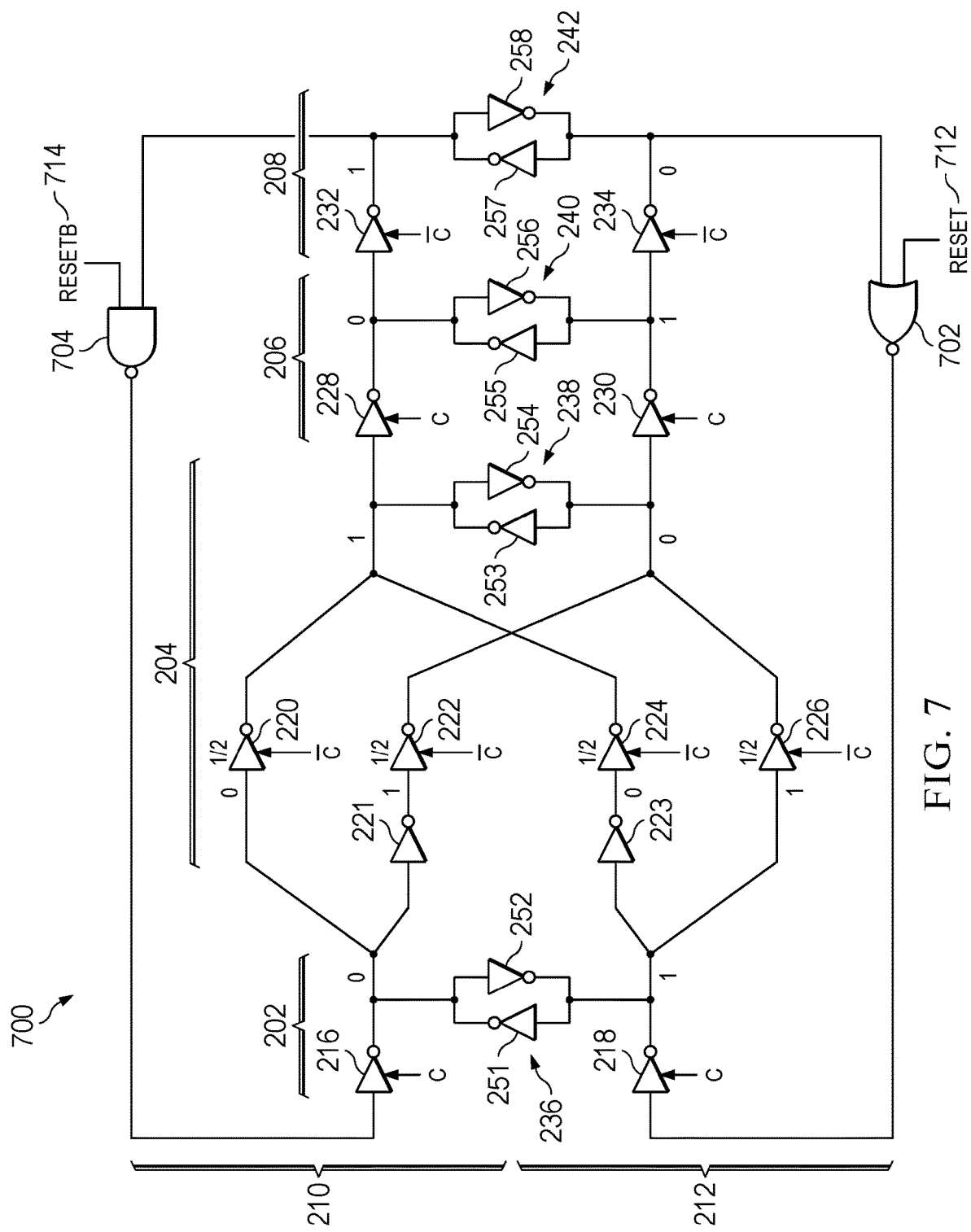
FIG. 7 is a schematic diagram of another example split cross-coupled pseudo-differential frequency divider circuit including control gates.

FIG. 7 shows a split cross-coupled pseudo-differential frequency divider circuit 700 including a feedback not- and (NAND) gate 704 and a feedback not- or (NOR) gate 702. The feedback NAND gate 704 and the feedback NOR gate 702 are connected between outputs of the fourth stage 208 and inputs of the first stage 202 of the split cross-coupled pseudo-differential frequency divider circuit 700. In the implementation of FIG. 7, the upper frequency divider loop 210 is connected to a first input of the feedback NAND gate 704 and the lower frequency divider loop 212 is connected to a first input of the feedback NOR gate 702. A second input of the feedback NOR gate 702 is connected to a non-inverse reset signal 712, and a second input of the feedback NAND gate 704 is connected to an inverse reset signal (resetb) 714.

In operation, the feedback NAND gate 704 produces an output which is the logical inverse of the output of an AND operation to two inputs of the feedback NAND gate 704 (e.g., the inverse reset (resetb) signal 714 and an output of the fourth stage 208 at the upper frequency divider loop 210). In other words, the output of the feedback NAND gate 704 is a logical low value "0" only when all of its inputs are at logical high values "1". Otherwise, the output is high. The feedback NOR gate 702 is the logical complement of the output of an OR operation performed on its inputs (e.g., the non-inverse reset signal 712 and an output of the fourth stage 208 at the lower frequency divider loop 212). If any of the inputs to the feedback NOR gate 702 are logic high values "1", the output of the feedback NOR gate 702 is a logic low value "0", whereas if both inputs to the feedback NOR gate 702 are logic low values "0", the output is a logic high value "1". The use of the feedback NAND gate 704 and the feedback NOR gate 702 with reset 712 and resetb 714 allow the split cross-coupled pseudo-differential frequency divider circuit 700 to be reset during operation.

The feedback NOR gate 702 and the feedback NAND gate 704 are example logic gates that invert an output signal after a last stage (e.g., the fourth stage 208) of the split cross-coupled pseudo-differential frequency divider 700. In other implementations, other suitable logic gates or combinations of logic gates may be utilized in the place of the feedback NOR gate 702 and the feedback NAND gate 704 as feedback logic gates to invert the output signals being fed back from the last stage (e.g., the fourth stage 208) to the first stage (e.g., the first stage 202) of the split cross-coupled pseudo-differential frequency divider 700.

Figure 8:
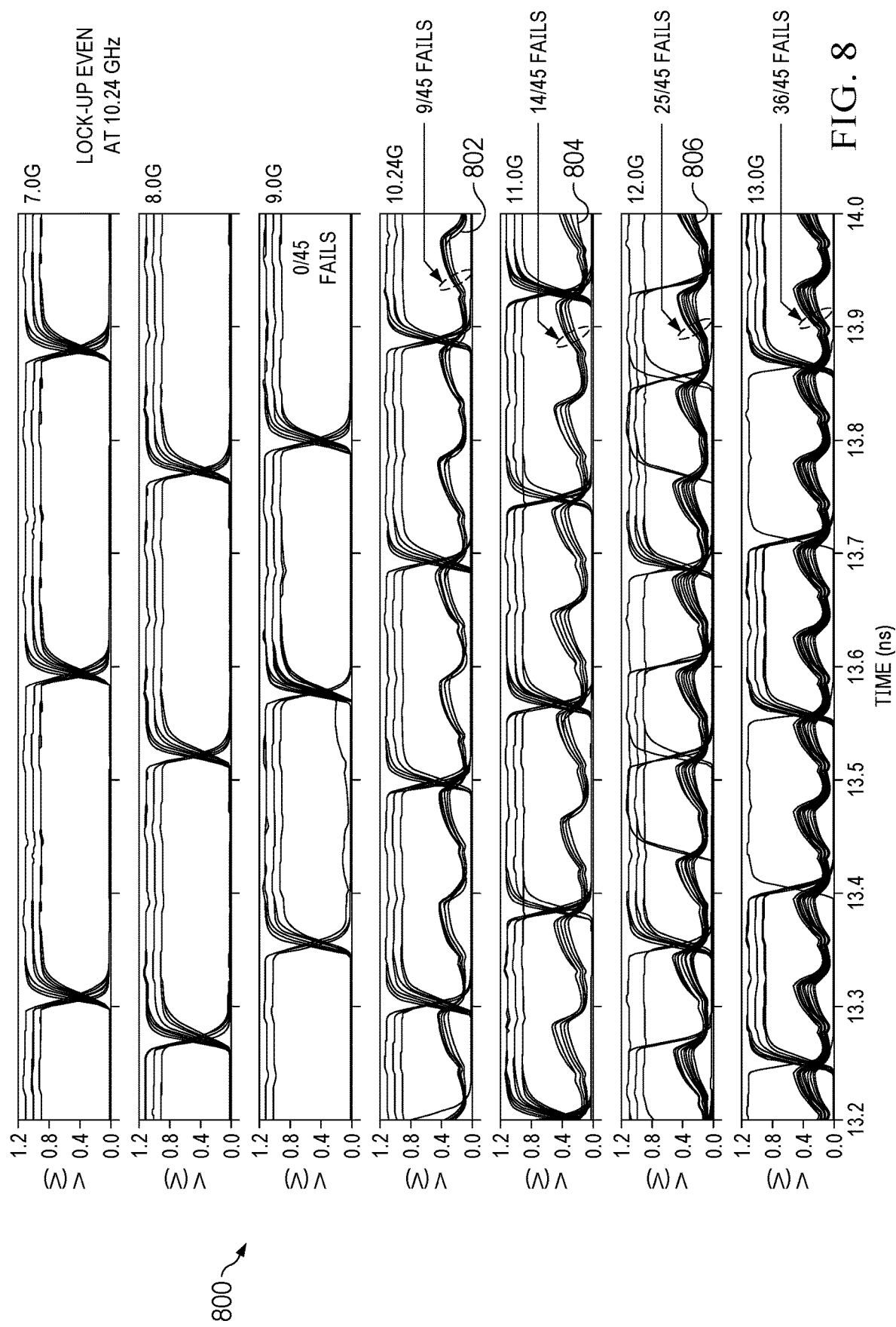
FIG. 8 shows example simulation results showing a lock-up of a prior frequency divider circuit due to unwanted common-mode operation.

FIG. 8 shows simulation results 800 of a prior problematic divide-by-four frequency divider circuit. The simulation results 800 are obtained using a Monte Carlo (MC) simulation method for 315 corners based on three semiconductor temperature values, three voltage values (vdd), and seven clock frequencies (Folk). In semiconductor testing/simulation, corners are extreme values of operating parameters such as temperature, voltage, frequency, process variation, etc. that can affect the operation of a semiconductor. The simulation results 800 show clock output signals collected from a divide-by-four frequency divider circuit over a range of the seven input clock frequencies shown as seven gigahertz (GHz) (7.0 G), eight GHz (8.0 G), nine GHz (9.0 G), 10.24 GHZ (10.24 G), 11 GHZ (11.0 G), 12 GHZ (12.0 G), and 13 GHZ (13.0 G). The simulation results 800 show that common-mode operation and lock-up occur nine times out of 45 runs (9/45 fails) 802 for a 10.24 GHz input clock frequency. At an 11 GHZ input clock frequency, common-mode operation and lock-up occur 14 times out of 45 runs (14/45 fails) 804. At a 12 GHz input clock frequency, common-mode operation and lock-up occur 25 times out of 45 runs (25/45 fails) 806. At a 13 GHz input clock frequency, common-mode operation and lock-up occur 36 times out of 45 runs (36/45 fails) 808. As such, a prior problematic divide-by-four frequency divider circuit becomes unreliable at input clock frequencies above 9 GHZ.

Figure 9:
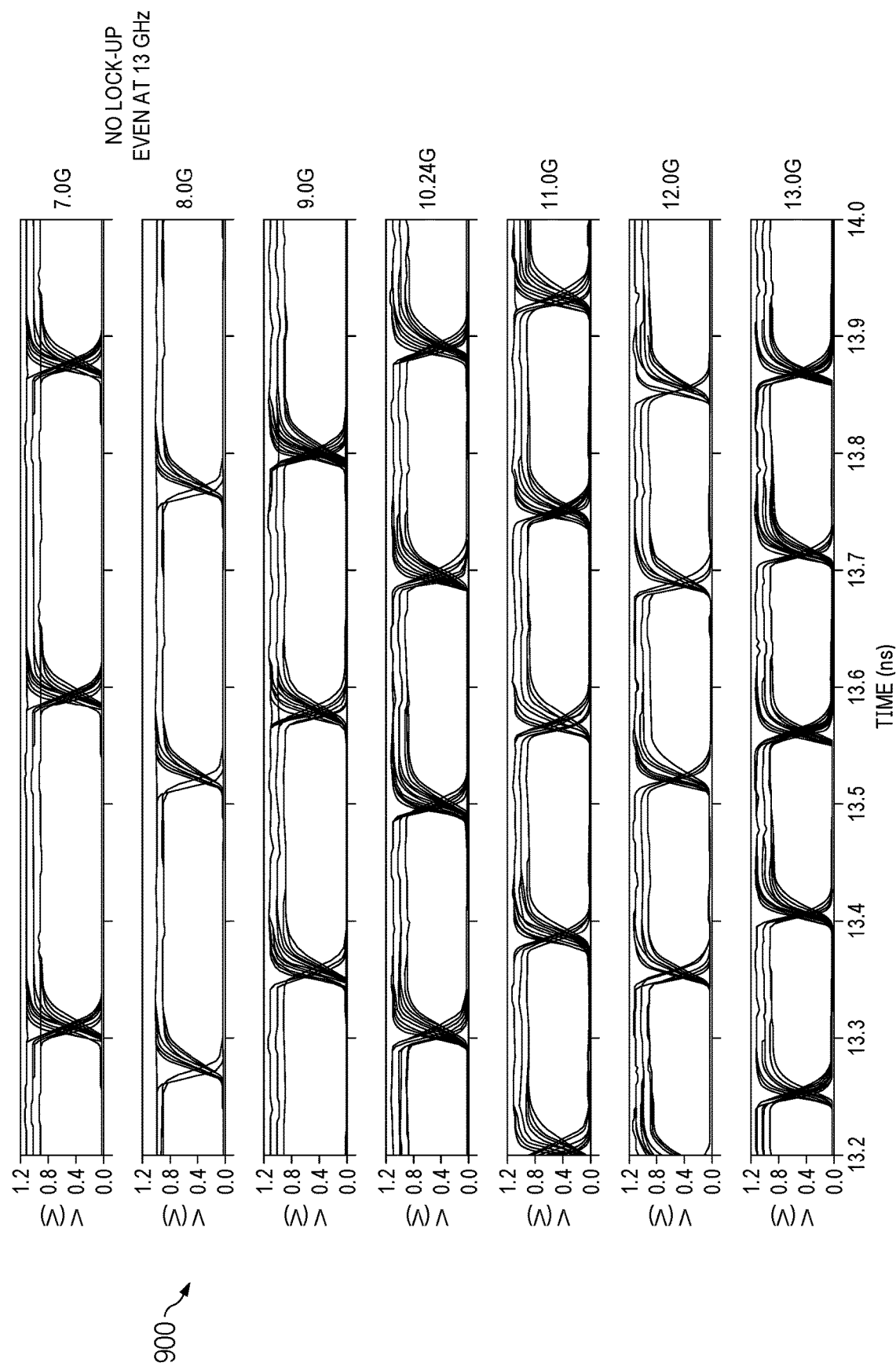
FIG. 9 shows example simulation results of a split cross-coupled pseudo-differential frequency divider circuit without lock-up due to unwanted common-mode operation.

FIG. 9. shows simulation results 900 of a divide-by-four frequency divider circuit such as the split cross-coupled pseudo-differential frequency divider circuit 200 of FIGS. 2 and 5. The simulation results 900 are obtained using a Monte Carlo (MC) simulation method for 2520 corners based on three semiconductor temperature values, three voltage values (vdd), and seven clock frequencies (Folk). The simulation results 900 show clock output signals collected from a divide-by-four frequency divider circuit over a range of the seven input clock frequencies shown as seven gigahertz (GHz) (7.0 G), eight GHz (8.0 G), nine GHz (9.0 G), 10.24 GHz (10.24 G), 11 GHz (11.0 G), 12 GHZ (12.0 G), and 13 GHz (13.0 G). The simulation results 900 show that common-mode operation and lock-up do not occur for a 10.24 GHZ input clock frequency, an 11 GHz input clock frequency, a 12 GHz input clock frequency, or even at a 13 GHz input clock frequency.

Figure 10:
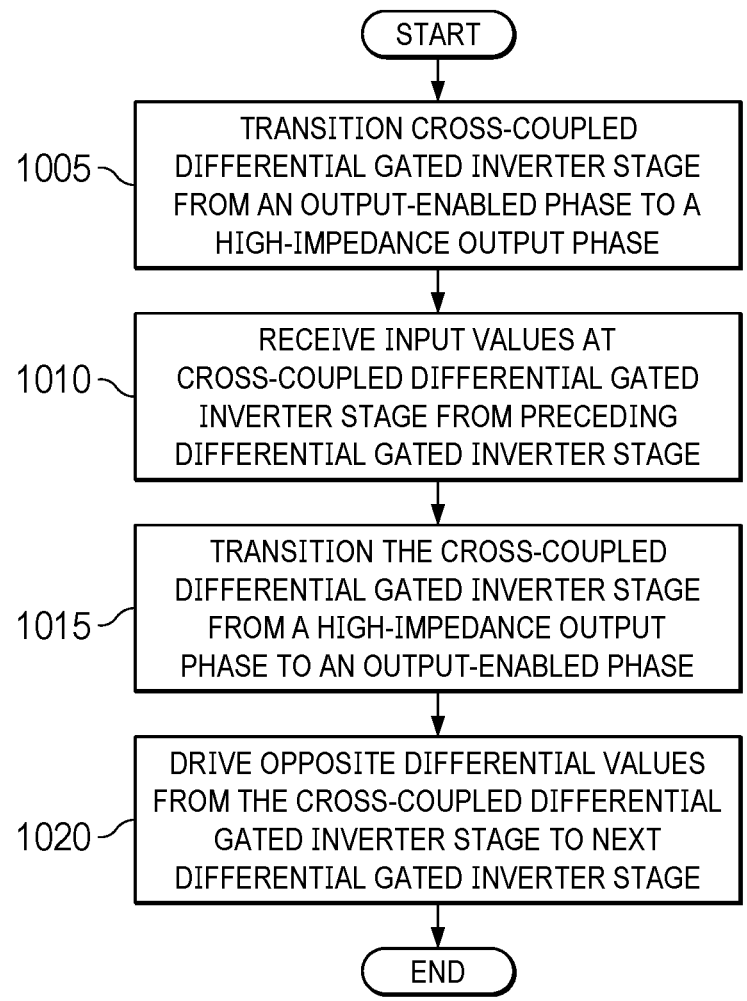
FIG. 10 is a flowchart representative of example operations of the example split cross-coupled pseudo-differential frequency divider circuits of FIGS. 2, 5, and 7.

FIG. 10 depicts a flow chart indicating a process by which the cross-coupled pseudo-differential gated inverter circuit stage 204 of FIGS. 2 and 5-7 operates. This process begins at block 1005, where the cross-coupled pseudo-differential gated inverter circuit stage 204 transitions from an output-enabled phase to a high-impedance output phase. For example, the outputs of the half-strength gated inverters 220, 222, 224, 226 of the cross-coupled pseudo-differential gated inverter circuit stage 204 transition from enabled to disabled (based on their output-enable terminals Cbar) so that the half-strength gated inverters 220, 222, 224, 226 are no longer driving their outputs.

Next at block 1010, the cross-coupled pseudo-differential gated inverter circuit stage 204 receives input values from first the cross-coupled bus-holder at the outputs of a preceding full-strength differential gated inverter circuit stage during an output-enabled phase of the preceding full-strength differential gated inverter stage and a high-impedance output phase of the half-strength differential gated inverter stage. For example, the outputs of the gated inverters 216, 218 of the first-stage pseudo-differential gated inverter circuit 202 are provided to inputs of the half-strength gated inverter 220, the inverter 221, the inverter 223, and the half-strength gated inverter 226 of the cross-coupled pseudo-differential gated inverter circuit stage 204.

After the input values are received, the cross-coupled pseudo-differential gated inverter circuit stage 204 transitions from the high-impedance output phase to an output-enabled phase at block 1015. For example, the outputs of the half-strength gated inverters 220, 222, 224, 226 of the cross-coupled pseudo-differential gated inverter circuit stage 204 transition from disabled to enabled (based on their output-enable terminals Cbar) so that the half-strength gated inverters 220, 222, 224, 226 drive their outputs.

Lastly at block 1020, the cross-coupled pseudo-differential gated inverter circuit stage 204 outputs opposite differential values to a second cross-coupled bus-holder at an input of a next full-strength differential gated inverter stage during the output-enabled phase of the cross-coupled pseudo-differential gated inverter circuit stage 204. For example, the outputs of the cross-coupled pseudo-differential gated inverter circuit stage 204 are provided to the bus-holder circuit 238 which is connected to inputs of the third-stage pseudo-differential gated inverter circuit 206.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C. (6) B with C, or (7) A with B and with C. As used herein in the context of describing structures, components, items, objects and/or things, the phrase "at least one of A and B" is intended to refer to implementations including any of (1) at least one A. (2) at least one B, or (3) at least one A and at least one B. Similarly, as used herein in the context of describing structures, components, items, objects and/or things, the phrase "at least one of A or B" is intended to refer to implementations including any of (1) at least one A. (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A. (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first", "second", "third", etc. are used merely to distinguish between elements of substantially the same type in terms of structure and/or function. These identifiers, as used in the detailed description, do not necessarily align with those used in the claims.

A device which is "configured to" perform a task or function may be configured (e.g., programmed and/or hard-wired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", and "lead" are used interchangeably. Unless specifically stated to the contrary, these terms are generally used to mean an interconnection between or a terminus of a device element, a circuit element, an integrated circuit, a device or other electronics or semiconductor component.

A circuit or device which is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

From the foregoing, it will be appreciated that example systems, apparatus, articles of manufacture, and methods have been described that prevent common-mode propagation and lock-up for frequency divider circuits. Described systems, apparatus, articles of manufacture, and methods improve the efficiency of using a computing device by improving frequency divider circuitry reliability above 10 GHz, which plays a role in determining the speed at which a computer executes instructions. Described systems, apparatus, articles of manufacture, and methods are accordingly directed to one or more improvement(s) in the operation of a machine such as a computer or other electronic and/or mechanical device.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent.

What is claimed is:

1. A circuit comprising:
   a first gated inverter having an input and an output;
   a second gated inverter having an input and an output;
   a third gated inverter having an input and an output;
   a fourth gated inverter having an input and an output;
   a first inverter having an input and an output, the output of the first inverter coupled to the input of the second gated inverter;
   a second inverter having an input and an output, the output of the second inverter coupled to the input of the third gated inverter;
   a fifth gated inverter having an output coupled to the input of the first gated inverter and the input of the first inverter;
   a sixth gated inverter having an output coupled to the input of the second inverter and the input of the fourth gated inverter;
   a seventh gated inverter having an input coupled to the output of the first gated inverter and the output of the third gated inverter; and
   an eighth gated inverter having an input coupled to the output of the second gated inverter and the output of the fourth gated inverter.

2. The circuit of claim 1, further including a first bus-holder circuit coupled to the input of the seventh gated inverter and the input of the eighth gated inverter, the first bus-holder circuit including a third inverter and a fourth inverter, an input of the third inverter and an output of the fourth inverter coupled to the input of the eighth gated inverter, an output of the third inverter and an input of the fourth inverter coupled to the input of the seventh gated inverter.

3. The circuit of claim 2, further including a second bus-holder circuit coupled to the output of the fifth gated inverter and the output of the sixth gated inverter, the second bus-holder circuit including a fifth inverter and a sixth inverter, an input of the fifth inverter and an output of the sixth inverter coupled to the output of the sixth gated inverter, an output of the fifth inverter and an input of the sixth inverter coupled to the output of the fifth gated inverter.

4. The circuit of claim 1, wherein a drive strength of the first gated inverter is approximately half of a drive strength of the fifth gated inverter, and a drive strength of the third gated inverter is approximately half of the drive strength of the fifth gated inverter.

5. The circuit of claim 4, wherein a drive strength of the second gated inverter is approximately half of the drive strength of the fifth gated inverter, and a drive strength of the fourth gated inverter is approximately half of the drive strength of the fifth gated inverter.

6. The circuit of claim 1, wherein a drive strength of the first gated inverter is substantially equal to a drive strength of the third gated inverter, a drive strength of the second gated inverter is substantially equal to a drive strength of the fourth gated inverter.

7. The circuit of claim 1, wherein the first gated inverter includes:
   a p-channel metal oxide semiconductor (pMOS) transistor having a gate terminal configured to receive a non-inverted clock signal; and
   an n-channel metal-oxide semiconductor (nMOS) transistor having a gate terminal configured to receive an inverted clock signal, the inverted clock signal out of phase by 180 degrees with the non-inverted clock signal.

8. The circuit of claim 1, wherein the fifth gated inverter and the seventh gated inverter are in a first frequency divider loop, the sixth gated inverter and the eighth gated inverter are in a second frequency divider loop, first clock outputs of the first frequency divider loop out of phase with corresponding second clock outputs of the second frequency divider loop.

9. The circuit of claim 8, wherein the first clock outputs are located at the outputs of the first gated inverter, the third gated inverter, the fifth gated inverter, and the seventh gated inverter, the second clock outputs are located at the outputs of the second gated inverter, the fourth gated inverter, the sixth gated inverter, and the eighth gated inverter.

10. The circuit of claim 1, further including a first feedback inverter coupled to an input of the fifth gated inverter in a first frequency divider loop, and a second feedback inverter coupled to on an input of the sixth gated inverter in a second frequency divider loop.

11. The circuit of claim 1, further including a first feedback logic gate coupled to an input of the fifth gated inverter in a first frequency divider loop, and a second feedback logic gate coupled to an input of the sixth gated inverter in a second frequency divider loop.

12. A circuit comprising:
    a first-stage differential gated inverter circuit including first and second gated inverters, the first gated inverter having an input and an output, the second gated inverter having an input and an output;
    a third-stage differential gated inverter circuit including third and fourth gated inverters, the third gated inverter having an input and an output, the fourth gated inverter having an input and an output; and
    a second-stage differential gated inverter circuit including:
    a first inverter having an input coupled to the output of the first gated inverter;
    a second inverter having an input coupled to the output of the second gated inverter;
    a fifth gated inverter having an input coupled to the output of the first gated inverter and having an output coupled to the input of the third gated inverter;
    a sixth gated inverter having an input coupled to an output of the first inverter and having an output coupled to the input of the fourth gated inverter;
    a seventh gated inverter having an input coupled to an output of the second inverter and having an output coupled to the input of the fourth gated inverter; and
    an eighth gated inverter having an input coupled to the output of the second gated inverter and having an output coupled to the input of the third gated inverter.

13. The circuit of claim 12, wherein the fifth gated inverter includes:

a p-channel metal oxide semiconductor (pMOS) transistor having a gate terminal configured to receive to a non-inverted clock signal; and an n-channel metal oxide semiconductor (nMOS) transistor having a gate terminal configured to receive an inverted clock signal.

14. The circuit of claim 13, wherein the PMOS transistor is a first PMOS transistor and the nMOS transistor is a first NMOS transistor, the first gated inverter includes:

a second pMOS transistor having a gate terminal configured to receive the inverted clock signal; and a second nMOS transistor having a gate terminal configured to receive the non-inverted clock signal.

15. The circuit of claim 14, wherein receiving of the non-inverted clock signal at the gate terminal of the first pMOS transistor and the gate terminal of the second nMOS transistor and receiving the inverted clock signal at the gate terminal of the first nMOS transistor and the gate terminal of the second pMOS transistor are to enable the output of the fifth gated inverter at a time during which the first gated inverter enters a high-impedance output state.

16. The circuit of claim 12, further including a bus-holder circuit coupled to the input of the third gated inverter and the input of the fourth gated inverter.

17. The circuit of claim 16, wherein the bus-holder circuit is configured to:

resolve first signal contention at the input of the third gated inverter to a first logic value; and resolve second signal contention at the input of the fourth gated inverter to a second logic value, the second logic value opposite the first logic value.

18. The circuit of claim 17, wherein the first signal contention at the input of the third gated inverter is created by different voltage values from the fifth gated inverter and the seventh gated inverter, the second signal contention at the input of the fourth gated inverter created by different voltage values from the sixth gated inverter and the eighth gated inverter.

19. The circuit of claim 18, wherein the different voltage values from the fifth gated inverter and the seventh gated inverter represent a logic one value from the fifth gated inverter and a logic zero value from the seventh gated inverter.

20. A circuit comprising:

a first gated inverter having an input and an output;

a second gated inverter having an input and an output;

a third gated inverter having an input and an output;

a fourth gated inverter having an input and an output;

a fifth gated inverter coupled in series with a first inverter between the output of the first gated inverter and the input of the fourth gated inverter;

a sixth gated inverter coupled in series with a second inverter between the output of the second gated inverter and the input of the third gated inverter;

a seventh gated inverter having an input and an output, the input of the seventh gated inverter coupled to the output of the first gated inverter, the output of the seventh gated inverter coupled to the input of the third gated inverter; and an eighth gated inverter having an input and an output, the input of the eighth gated inverter coupled to the output of the second gated inverter, the output of the eighth gated inverter coupled to the input of the fourth gated inverter.

21. The circuit of claim 20, further including a bus-holder circuit coupled to the input of the third gated inverter and the input of the fourth gated inverter.

22. The circuit of claim 20, wherein a drive strength of the fifth gated inverter is approximately half of a drive strength of the first gated inverter, a drive strength of the sixth gated inverter is approximately half of a drive strength of the first gated inverter, a drive strength of the seventh gated inverter is approximately half of a drive strength of the first gated inverter, and a drive strength of the eighth gated inverter is approximately half of a drive strength of the first gated inverter.

23. The circuit of claim 20, wherein the first gated inverter and the third gated inverter are in a first frequency divider loop, the second gated inverter and the fourth gated inverter are in a second frequency divider loop, first outputs of the first frequency divider loop out of phase with corresponding second outputs of the second frequency divider loop.

* * * * *